US011750185B2

(12) United States Patent
Nimmagadda et al.

(10) Patent No.: US 11,750,185 B2
(45) Date of Patent: Sep. 5, 2023

(54) CALIBRATED LINEAR DUTY CYCLE CORRECTION

(71) Applicant: XILINX, INC., San Jose, CA (US)

(72) Inventors: Siva Charan Nimmagadda, Nellore (IN); Xiaobao Wang, Cupertino, CA (US); Vinit Shah, Cupertino, CA (US); Sabarathnam Ekambaram, Secunderabad (IN); Hari Bilash Dubey, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/482,336

(22) Filed: Sep. 22, 2021

(65) Prior Publication Data

US 2023/0086781 A1    Mar. 23, 2023

(51) Int. Cl.
*H03K 5/156* (2006.01)
*H03K 5/134* (2014.01)
*H03K 5/135* (2006.01)
*G11C 7/22* (2006.01)

(52) U.S. Cl.
CPC .......... *H03K 5/1565* (2013.01); *G11C 7/222* (2013.01); *H03K 5/134* (2014.07); *H03K 5/135* (2013.01)

(58) Field of Classification Search
None
See application file for complete search history.

(56) References Cited

U.S. PATENT DOCUMENTS

| 7,496,155 | B1 | 2/2009 | Lu et al. |
| 7,616,038 | B2* | 11/2009 | Oh .......................... H03K 3/84 327/263 |
| 7,750,713 | B2* | 7/2010 | Oh .......................... G06F 1/04 327/299 |
| 7,913,199 | B2* | 3/2011 | Boerstler ............. H03K 5/1565 327/175 |
| 8,933,738 | B2* | 1/2015 | Wu ..................... H03K 5/1565 327/261 |
| 9,054,645 | B1 | 6/2015 | Wang et al. |
| 9,876,489 | B1 | 1/2018 | Casey et al. |
| 10,630,272 | B1* | 4/2020 | Ashtiani ................ H03L 7/0818 |
| 10,998,864 | B1 | 5/2021 | Francis et al. |
| 11,005,467 | B1* | 5/2021 | Lin ........................ H03K 3/017 |
| 2022/0052678 | A1* | 2/2022 | Choi .................... H03K 5/1565 |

* cited by examiner

*Primary Examiner* — Cassandra F Cox
(74) *Attorney, Agent, or Firm* — Patterson + Sheridan, LLP

(57) ABSTRACT

Examples describe a duty cycle correction circuit for correcting duty cycle distortion from memory. One example is an integrated circuit for correcting an input clock signal. The integrated circuit includes a first leg circuit and a second leg circuit. The first leg circuit and the second leg circuit both comprise a charging circuit and a discharging circuit. Each charging circuit comprises a first plurality of transistors and each discharging circuit comprises a second plurality of transistors. The charging circuit is coupled to the discharging circuit in series. A number of transistors of the first plurality of transistors in the first leg circuit is different from a number of transistors of the first plurality of transistors in the second leg circuit.

20 Claims, 8 Drawing Sheets

CALIBRATED LINEAR DUTY CYCLE CORRECTION

TECHNICAL FIELD

Examples of the present disclosure generally relate to duty cycle correction and, in particular, to calibrated linear duty cycle correction.

BACKGROUND

Generally, a memory interface includes memory and a memory controller, which can be disposed in an integrated circuit (IC) (e.g., a field programmable gate array (FPGA), an application specific integrated circuit (ASIC), a system on a chip (SoC), and the like). The memory controller is positioned inside an IC and the memory (e.g., dedicated random access memory (DRAM)) is external to the IC and is often supplied by the external vendor. In cases where the memory is high bandwidth memory (HBM), both the memory controller and the memory are disposed on the same die.

A phase locked loop (PLL) circuit supplies a clock signal to the memory controller and the controller transmits the clock signal to the memory using channels inside the controller. These clock signals traverse through a clock network inside the memory and are transmitted back to the controller. An output from the clock network is then transmitted back to input/outputs (IOs) of the IC, which acts as a clock for all HBMIO receivers. Different external vendors supply memory dies with different clock distribution networks and also load conditions of the memory vary with different products. Due to these differences, the received clock may get distorted. Additionally, the clock network inside memory can introduce significant duty cycle distortion (DCD) jitter before the clock signal is transmitted back to the memory controller. A distorted clock signal may cause issues with the timing budget and may hamper timing closure at higher speeds.

To address the distorted clock signal, some duty cycle correction circuits can correct distortion from the clock network of the memory. However, these duty cycle correction circuits lack linearity. That is, the duty cycle correction is unequal between the different duty cycle correction codes (between each bit increment of the duty cycle correction codes). Linearity in duty cycle correction is a critical metric for ICs operating at higher operating speeds.

Accordingly, what is needed is a solution to address the DOD introduced by the clock network inside memory.

SUMMARY

Examples of the present disclosure generally relate to duty cycle correction between memory controllers and memory to address duty cycle distortion introduced by a clock network in the memory.

One example of the present disclosure is an integrated circuit (IC) for correcting an input clock signal. The IC includes a first leg circuit and a second leg circuit. The first leg circuit and the second leg circuit both comprise a charging circuit and a discharging circuit. Each charging circuit comprises a first plurality of transistors and each discharging circuit comprises a second plurality of transistors. The charging circuit is coupled to the discharging circuit in series. A number of transistors of the first plurality of transistors in the first leg circuit is different from a number of transistors of the first plurality of transistors in the second leg circuit.

Another example of the present disclosure is an IC for correcting an input clock signal. The IC includes a plurality of leg circuits. Each leg circuit comprises a charging circuit and a discharging circuit. The charging circuit of each leg circuit comprises a first plurality of transistor. The discharging circuit is coupled in series to the charging circuit. The discharging circuit of each leg circuit comprises a second plurality of transistors. Each leg circuit has a different number of transistors for the first plurality of transistors and the second plurality of transistors.

Another example of the present disclosure is an IC for correcting an input clock signal. The IC includes a first leg circuit and a second leg circuit. The first leg circuit and the second leg circuit both comprise a charging circuit and a discharging circuit. Each charging circuit comprises a first resistor and each discharging circuit comprises a second resistor. The charging circuit is coupled in series to the discharging circuit. A value of the first resistor of the first leg circuit is different from a value of the first resistor of the second leg circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
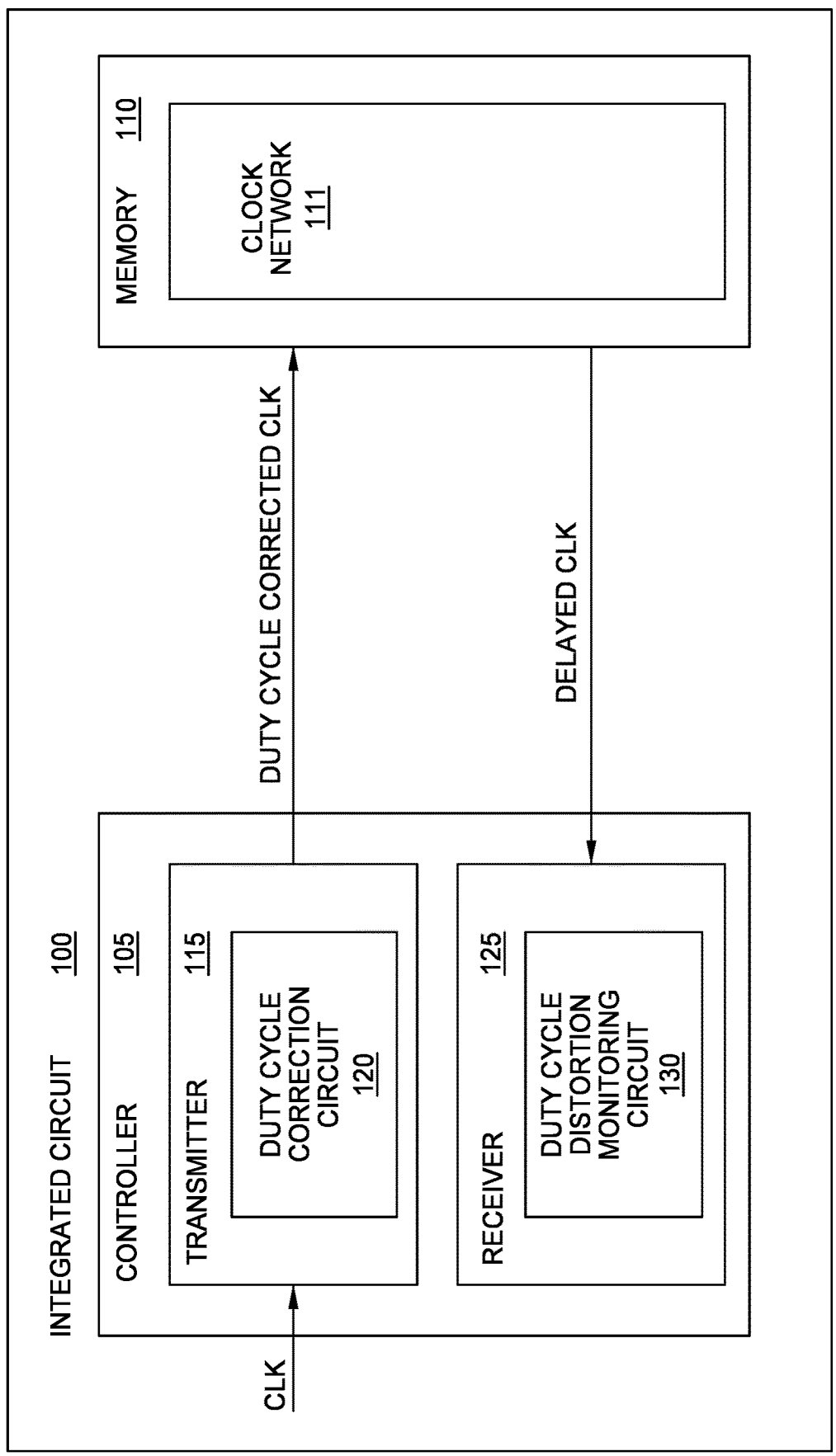
FIG. 1 is a diagram of an integrated circuit with a duty cycle corrector circuit, according to some examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe calibrated linear duty cycle correction to address duty cycle distortion introduced by memory during operation. The duty cycle correction involves including circuit elements (e.g., resistors, transistors) to a duty cycle correction circuit. The example duty cycle correction circuit described herein linearizes the duty cycle correction for each duty cycle correction code.

As described herein, duty cycle distortion has been a critical issue in the overall clock jitter. At higher clock speeds, duty cycle correction helps to mitigate the jitter due to duty cycle distortion and meet the timing budget requirements. A programmable linear type duty cycle correction circuit is described. Also, a method for the duty cycle correction circuit is also described. The example duty cycle correction circuit described herein provides auto-correction, linearity, programmability and low silicon area.

FIG. 1 is a diagram of an integrated circuit with a duty cycle corrector circuit, according to some examples. The integrated circuit 100 includes a controller 105 and memory 110. The controller 105 receives a clock signal (CLK) and pre-emptively corrects the duty cycle of the clock signal before sending the duty cycle corrected clock signal to the memory 110. The memory 110 receives the duty cycle corrected clock signal, and the duty cycle corrected clock signal passes through the clock network 111 of the memory 110.

In this example, the controller 105 and the memory 110 are disposed on the same integrated circuit 100 (i.e., the same die). In other examples, the controller 105 and the memory 110 can be disposed on different integrated circuits (i.e., different dies). In some examples, the controller 105 can use a silicon interposer to interact with the memory 110.

The controller 105 includes a transmitter 115 and a receiver 125. As mentioned, the controller 105 receives a clock signal that is pre-emptively duty cycle corrected before being sent to the memory 110. The controller 105 also receives a delayed clock signal from the memory via the receiver 125. In some examples, because the controller 105 preemptively duty cycle corrected the clock signal before sending it to the memory, the delayed clock signal matches the initial clock signal (CLK) received by the controller 105.

According to some examples, the transmitter 115 of the controller 105 includes a duty cycle correction circuit 120. The duty cycle correction circuit 120 corrects the duty cycle of the clock signal received by the controller 105, and allows for the controller 105 to send the duty cycle corrected clock signal to the memory 110. In some examples, the duty cycle correction circuit can be implemented inside high bandwidth memory (HBM) HBM2E input/output (IO) for the clock paths CK_T & CK_C.

Once the memory 110 receives the duty cycle corrected clock signal, the duty cycle corrected clock signal passes through a clock network 111 of the memory 110. The clock network 111 of the memory 110 introduces duty cycle distortion jitter into the duty cycle corrected clock signal. Because the duty cycle corrected clock signal is pre-emptively duty cycle corrected, by passing through the clock network 111, the duty cycle corrected clock becomes delayed based on the introduced duty cycle distortion jitter.

In some examples, the duty cycle correction applied to the clock signal compensates for the introduced duty cycle distortion jitter. The clock signal sent from the memory 110 back to the controller 105 is corrected and corresponds to the clock signal initially received by the controller 105. The memory 110 can include one or more of high bandwidth memory (HBM), random access memory (RAM), read only memory (ROM), magnetic read/write memory, FLASH memory, solid state memory, or the like as well as combinations thereof.

Consequently, according to some examples, the receiver 125 includes a duty cycle distortion monitoring circuit 130, and can receive the delayed version of the duty cycle corrected clock signal from memory 110. The duty cycle distortion monitoring circuit 130 can monitor the delayed version of the duty cycle corrected clock signal. In some examples, the duty cycle distortion monitoring circuit 130 compares the delayed version of the duty cycle corrected clock signal to ensure that the clock signal from the memory 110 corresponds accurately to the clock signal initially received by the controller 105 (i.e., CLK). If the compared signals are different, the duty cycle distortion monitoring circuit 130 can determine a new duty cycle distortion code to be used by the duty cycle correction circuit 120.

Figure 2:
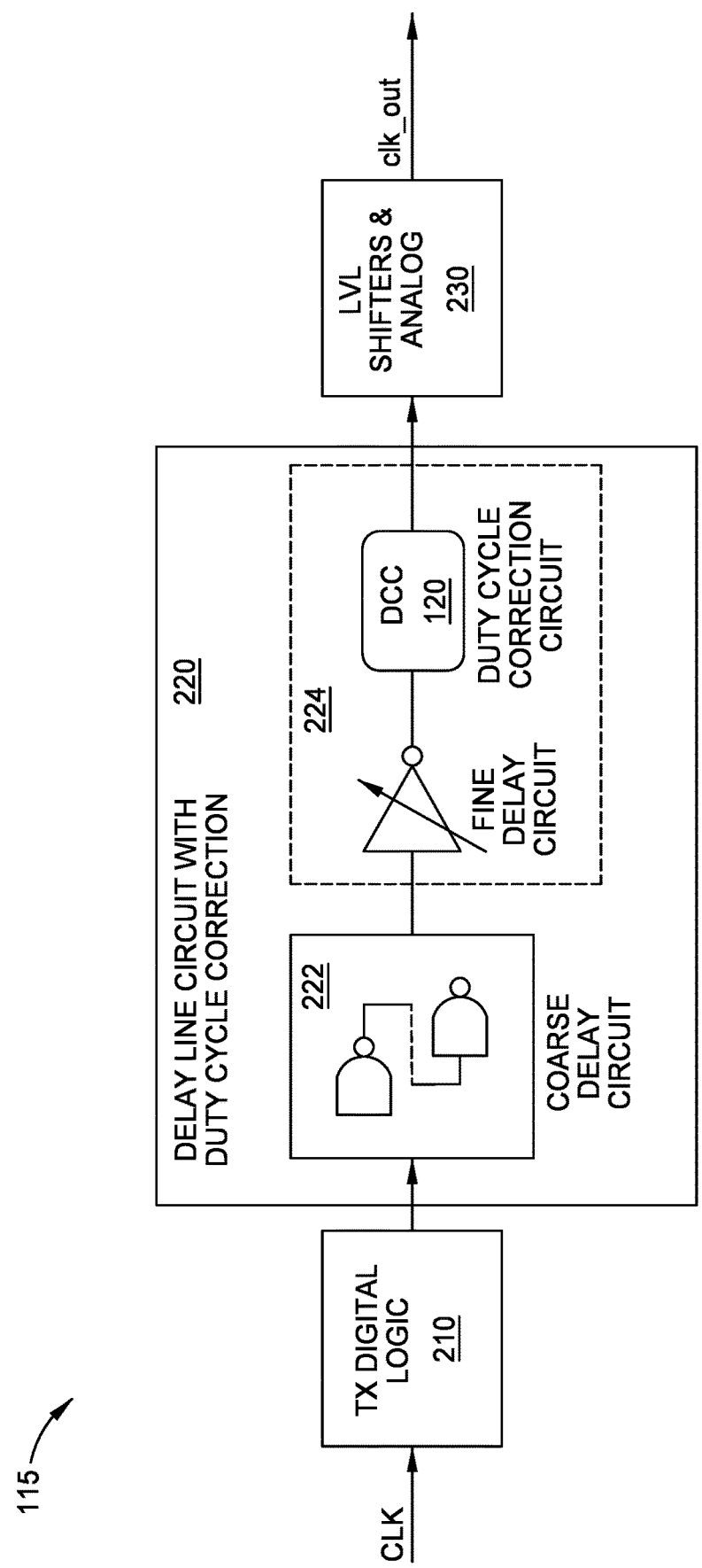
FIG. 2 is a diagram of clock transmission using a delay line circuit with a duty cycle corrector circuit, according to some examples.

FIG. 2 is a flow diagram illustrating the flow of the clock signal inside a controller (e.g., controller 105 of FIG. 1). As mentioned, the controller 105 includes the transmitter 115 through which the clock signal passes. In this example, the transmitter 115 includes transmission digital logic 210, a delay line circuit 220 with duty cycle correction circuit 120, and a level shifter circuit 230. The transmission digital logic 210 processes the clock signal before sending it to the delay line circuit 220 with duty cycle correction. The delay line circuit 220 with duty cycle correction circuit 120 receives the processed clock signal from the transmission digital logic 210 and processes the clock signal before sending it to the level shifter circuit 230. The level shifter circuit 230 receives a duty cycle corrected version of the clock signal and level shifts the duty cycle corrected version of the clock signal before sending it on to the memory 110. The transmission digital logic 210 includes a data serializer and the level shifter circuit 230 is configured to boost a low voltage signal to a high voltage signal.

The delay line circuit 220 with duty cycle correction circuit 120 aligns the data signal with respect to the clock signal from the transmission digital logic. In some examples, the delay line circuit 220 delays the clock signal using a coarse delay circuit 222 and then a fine delay circuit 224 before the delay line circuit 220 sends the clock signal to the duty cycle correction circuit 120. In one embodiment, the coarse delay circuit 222 includes a cascade of NAND gates and provides coarse delay (e.g., larger amounts of delay) via circuit components of the NAND gates. The fine delay circuit 224 involves an inverter with different drive strengths to meet the fine delay requirements. The fine delay circuit 224 provides fine delay (e.g., smaller amounts of delay) to the clock signal. In some examples, to maintain the same phase relationship (from input to output) for delay circuits, another inverter can be added to meet duty cycle correction requirements because the fine delay circuit 224 may introduce phase inversion. The coarse delay circuit 222 and the fine delay circuit 224 each delay the clock signal passing through the delay line circuit 220, so that by the clock signal reaches the duty cycle correction circuit 120, the duty cycle correction circuit 120 can duty cycle correct the delayed clock signal.

Figure 3:
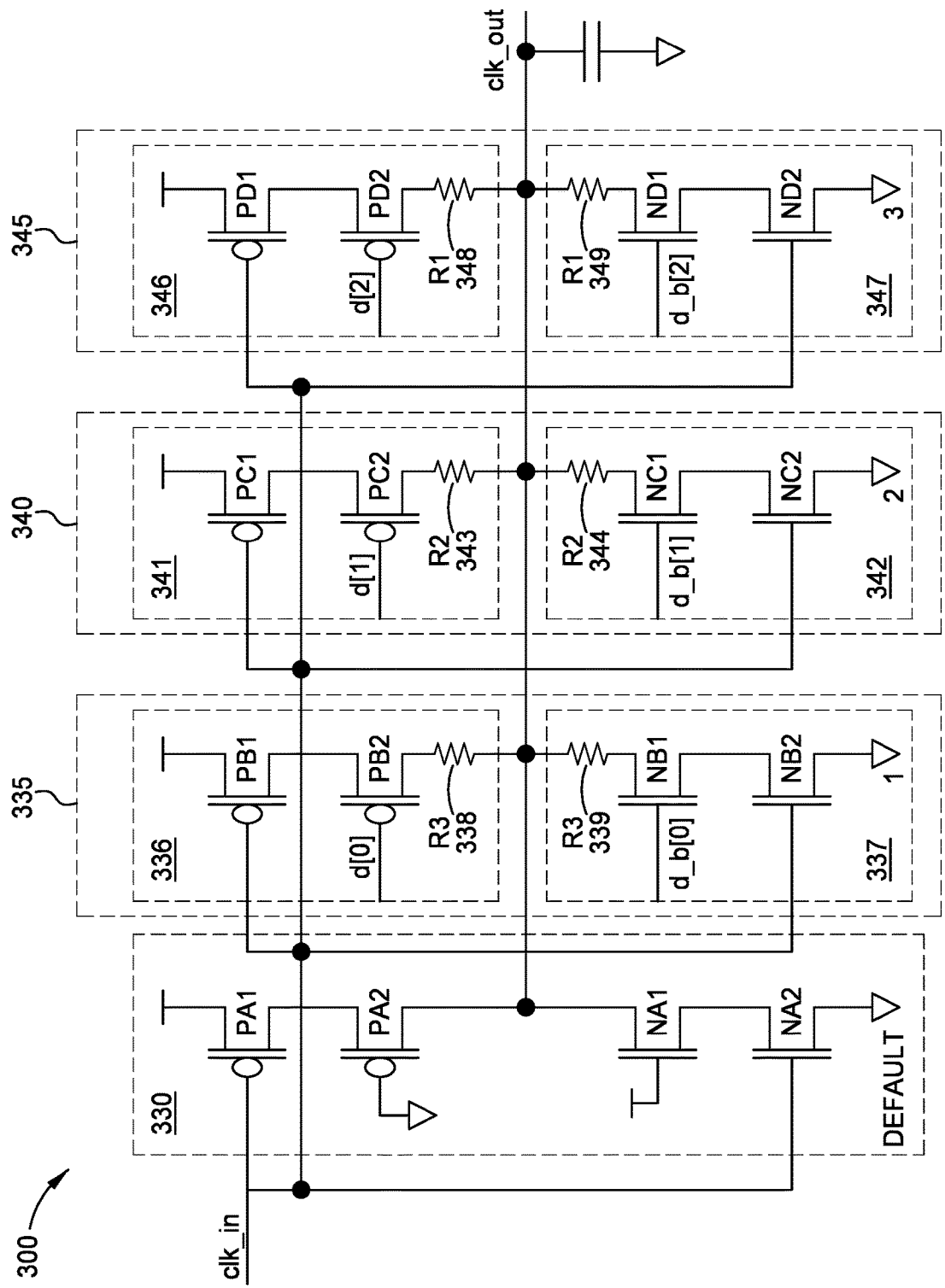
FIG. 3 illustrates a duty cycle corrector circuit with resistors, according to some examples.

FIG. 3 illustrates a duty cycle correction circuit 300 with resistors, according to some examples. The duty cycle correction circuit 300 can be used as the duty cycle correction circuit 120 of FIG. 1 in the transmitter 115 of the controller 105.

The duty cycle correction circuit 300 includes a default leg circuit 330, a first leg circuit 335, a second leg circuit 340, and a third leg circuit 345. In some examples, the number of leg circuits aside from the default leg circuit 330 depends on the number of bits of a duty cycle correction code. For example, for four-bit duty cycle correction codes, the duty cycle correction circuit 300 includes four leg circuits, one of which is the default leg circuit 330. In some cases, for three-bit duty cycle correction codes, the duty cycle correction circuit 300 includes three leg circuits, one of which is the default leg circuit 330. When applied to the duty cycle correction circuit 300, the duty cycle correction code is used to turn on or off parts of the duty cycle correction circuit 300 to duty correct the clock signal passing through the duty cycle correction circuit 300. In some examples, the duty cycle correction circuit 300 is an inverting stage for the clock signal before the clock signal goes to the memory 110.

As mentioned, the duty cycle correction circuit 300 includes a default leg circuit 330, and the default leg circuit includes four transistors: transistor PA1, transistor PA2, transistor NA1, and transistor NA2. Transistors PA1 and PA2 are P-channel metal-oxide-semiconductor field-effect transistors (MOSFETs) and transistors NA1 and NA2 are N-channel MOSFETs. The default leg circuit 330 is coupled to the incoming clock signal (clk_in) (e.g., clock signal CLK of FIG. 1, clock signal CLK of FIG. 2) via transistor PA1 and transistor NA2. Transistor PA1 is coupled to a source voltage, to the incoming clock signal, and to transistor PA2. Transistor PA2 is coupled to transistor PA1, to a ground voltage, to transistor NA1, and to the outgoing clock signal (clk_out). Transistor NA1 is coupled to transistor PA2, the source voltage, to transistors NA2, and to the outgoing clock signal (clk_out). Transistor NA2 is coupled to transistor NA1, to the incoming clock signal, and to ground voltage. In some examples, the default leg circuit 330 is powered ON during the operation of the controller 105.

The first leg circuit 335 includes a charging circuit 336 and a discharging circuit 337. The charging circuit 336 includes transistor PB1 and transistor PB2, and the discharging circuit 337 includes transistor NB1 and transistor NB2. The transistor PB1 and transistor PB2 are P-channel MOSFETs and transistor NB1 and NB2 are N-channel MOSFETs. The charging circuit 336 includes a resistor 338 and the discharging circuit 337 also includes a resistor 339. Details about the resistors 338 and 339 are further discussed below.

The transistor PB1 is coupled to a source voltage, and to the incoming clock signal, and to the transistor PB2. The transistor PB2 is coupled to transistor PB1, to the zeroth bit of the duty cycle correction code, and to the resistor 338. The resistor 338 is coupled to the transistor PB2, to the outgoing clock signal, and to the resistor 339. The resistor 339 is coupled to the resistor 338, to the outgoing clock signal, and to the transistor NB1. The transistor NB1 is coupled to resistor 339, to the zeroth bit of the inverted version of the duty cycle correction code, and to transistor NB2. The transistor NB2 is coupled to transistor NB1, to the incoming clock signal, and to ground voltage.

The second leg circuit 340 includes a charging circuit 341 and a discharging circuit 342. The charging circuit 341 includes transistor PC1 and transistor PC2, and the discharging circuit 342 includes transistor NC1 and transistor NC2. The transistor PC1 and transistor PC2 are P-channel MOSFETs and transistor NC1 and NC2 are N-channel MOSFETs. The charging circuit 341 includes a resistor 343 and the discharging circuit 342 also includes a resistor 344. Details about the resistors 343 and 344 are further discussed below.

The transistor PC1 is coupled to a source voltage, and to the incoming clock signal, and to the transistor PC2. The transistor PC2 is coupled to transistor PC1, to the zeroth bit of the duty cycle correction code, and to the resistor 343. The resistor 343 is coupled to the transistor PC2, to the outgoing clock signal, and to the resistor 344. The resistor 344 is coupled to the resistor 343, to the outgoing clock signal, and to the transistor NC1. The transistor NC1 is coupled to resistor 344, to the zeroth bit of the inverted version of the duty cycle correction code, and to transistor NC2. The transistor NC2 is coupled to transistor NC1, to the incoming clock signal, and to ground voltage.

In some examples, the duty cycle correction circuit 300 includes a third leg circuit 345. The third leg circuit 345 includes a charging circuit 346 and a discharging circuit 347. The charging circuit 346 includes transistor PD1 and PD2, and the discharging circuit 347 includes transistor ND1 and transistor ND2. The transistor PD1 and transistor PD2 are P-channel MOSFETs and transistor ND1 and ND2 are N-channel MOSFETs. The charging circuit 346 includes a resistor 348 and the discharging circuit 347 also includes a resistor 349. Details about the resistor 348 and 349 are further discussed below.

The transistor PD1 is coupled to a source voltage, and to the incoming clock signal, and to the transistor PD2. The transistor PD2 is coupled to transistor PD1, to the zeroth bit of the duty cycle correction code, and to the resistor 348. The resistor 348 is coupled to the transistor PD2, to the outgoing clock signal, and to the resistor 349. The resistor 349 is coupled to the resistor 348, to the outgoing clock signal, and to the transistor ND1. The transistor ND1 is coupled to resistor 349, to the zeroth bit of the inverted version of the duty cycle correction code, and to transistor ND2. The transistor ND2 is coupled to transistor ND1, to the incoming clock signal, and to ground voltage.

According to some examples, as mentioned, the number of leg circuits depends on the number of bits for duty cycle correction codes. For duty cycle correction codes having four bits, three bits are used to program the duty ratio and the fourth bit (e.g., the most significant bit) is used as a decision bit. The decision bit is used to correct the duty ratio to a positive side (e.g., greater than 50%) or to a negative side (e.g., less than 50%).

In some examples, the decision bit is based in adjusting either to the edge rates (e.g., rising edge, falling edge). Slowing down the rising edge of the clock signal with respect to the falling edge shrinks the pulse width of the clock and reduces the duty cycle ratio. Similarly, sluggish falling edge of the clock signal with regards to the rising edge of the clock signal leads to increased duty cycle ratio.

To reduce the duty ratio of the output clock signal (clk_out) (i.e., the clock signal going to the memory 110), the rising edge of the clock signal needs to be slower than the falling edge of the clock signal. In other words, the falling edge of the clock signal needs to be faster than the rising edge of the clock signal. Accordingly, transistors NB1 and NB2 and transistors NA1, NA2 are turned "ON" or are active to ensure that the falling edge of the clock signal needs to be faster than the rising edge of the clock signal. If the ratio of drive strength of transistors PA1 and PA2 and transistors NA1 and NA2 are kept uniform, turning on or activating transistor NB1 using one bit of the inverted version of the duty cycle correction code (e.g., d_b[0]) further reduces the falling time of the clock signal with reference to the rising time of the clock signal. In some examples, the reduction in falling time of the clock signal is proportional to the ratio of transistors NA1 and NA2 to transistors NB1 and NB2.

Similarly, to increase the duty ratio of the output clock (clk_out) (i.e., the clock signal going to the memory 110), the rising edge of the clock signal needs to be faster than the falling edge of the clock signal. In some examples, activating or turning "ON" transistors PB1 and PB2 in addition to transistor PA1 and transistor PA2 can increase the speed of the rising edge of the clock signal compared to the speed of the falling edge of the clock signal. If the ratio of drive strength of transistors PA1 and PA2 and transistors NA and NA2 are kept uniform, turning on transistors PB1 and PB2 using a bit of the duty cycle correction code (e.g., d[0] bit) further reduces the rising time of the clock signal with reference to falling time of the clock signal. The reduction in rising time of the clock signal can be proportional to ratio of transistors PA1 and PA2 and transistors PB1 and PB2.

In some examples, the use of the duty cycle correction code applied to the transistors of the duty cycle correction code same concept can be extended to multiple leg circuits and can increase the range of correction. The sizing of the transistors PB2 and NB1 are critical to adjust the edge rates.

As mentioned, according to some examples, to improve the linearity of duty cycle correction, the duty cycle correction circuit 300 includes resistors to vary the time constant and adjust the edge rates. By controlling the edge rates, duty cycle can be programmed or adjusted. The duty cycle correction circuit 300 with resistors increases linearity of the duty cycle correction.

The value of the resistors 338, 339, 343, 344, 348, and 349 of the duty cycle correction circuit 120 can be calculated using the following equations:

$$-\frac{t}{RC} = \ln\left(1 - \frac{V_o}{V_i}\right)$$

In some examples, the resistors 338, 339, 343, 344, 348, and 349 of the duty cycle correction circuit 300 can be arranged in the duty cycle correction circuit 300 based on the ratio 4:2:1 (e.g., R1:R2:R3) in order to achieve linear duty cycle correction.

However, the example duty cycle correction circuit 300 with resistors 338, 339, 343, 344, 348, and 349 occupies more die area because of the use of resistors 338, 339, 343, 344, 348, and 349. Resistors can be expensive in terms of silicon real estate.

Figure 4:
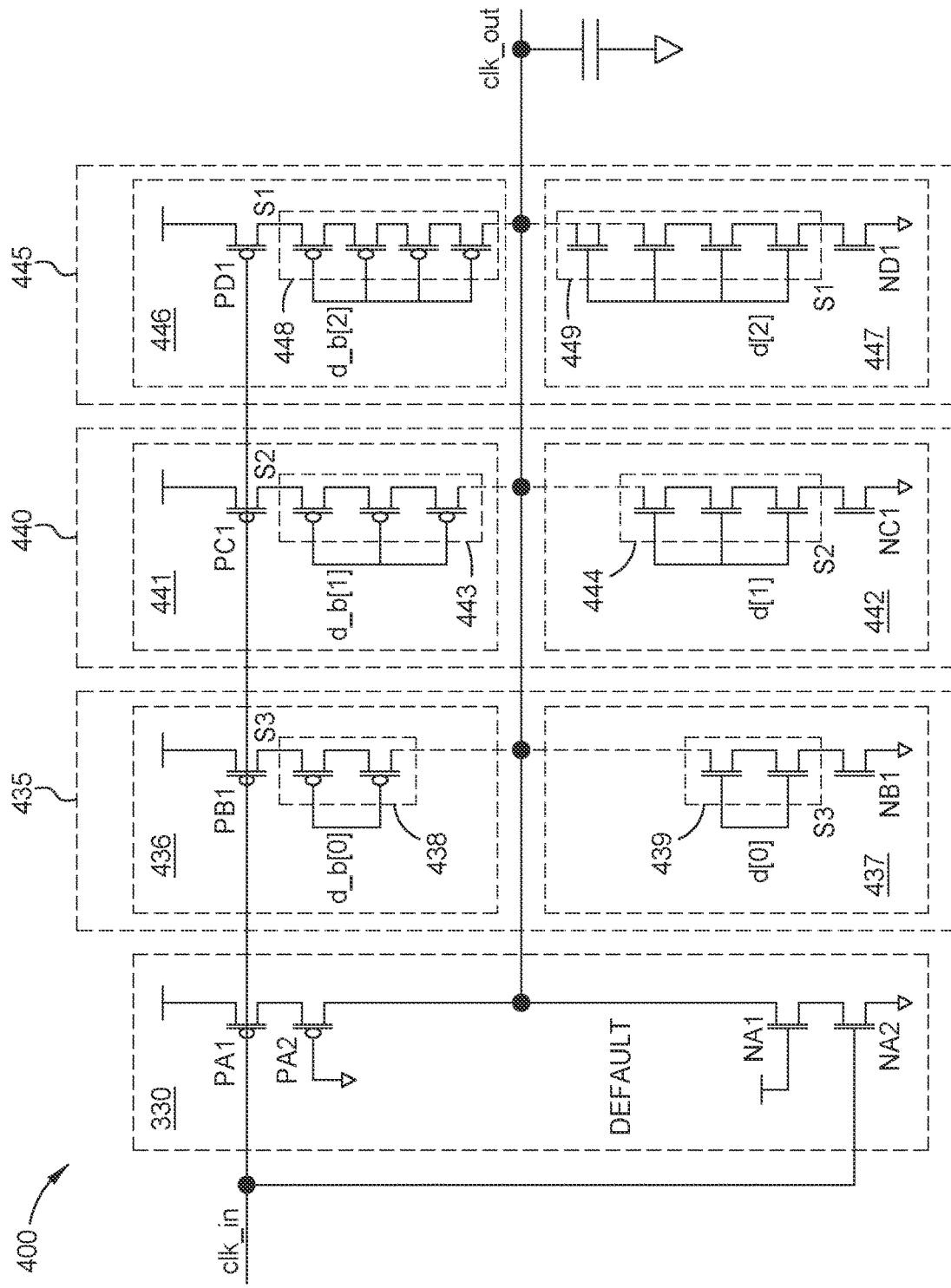
FIG. 4 illustrates a duty cycle corrector circuit with transistors, according to some examples.

FIG. 4 illustrates a duty cycle correction circuit 400 with transistors, according to some examples. According to some examples, transistors can replace the resistors 338, 339, 343, 344, 348, and 349 of duty cycle correction circuit 300 of FIG. 3. For examples, MOS transistors can mimic resistor functionality and minimize the total silicon area used by the duty cycle correction circuit 300. In some examples, stacked transistors (e.g., multiple transistors coupled together in series) in each leg circuit can be used to mimic resistor functionality. The order of the stacked transistors can be chosen depending on the linear step size requirement.

The duty cycle correction circuit 400 includes a default leg circuit 330. The default leg circuit 330 can be the same default leg circuit 330 of FIG. 3. The default leg circuit 330 includes four transistors: transistor PA1, transistor PA2, transistor NA1, and transistor NA2. Transistors PA1 and PA2 are P-channel MOSFETs and transistors NA1 and NA2 are N-channel MOSFETs. The default leg circuit 330 is coupled to the incoming clock signal (clk_in) via transistor PA1 and transistor NA2. Transistor PA1 is coupled to a source voltage, to the incoming clock signal, and to transistor PA2. Transistor PA2 is coupled to transistor PA1, to a ground voltage, to transistor NA1, and to the outgoing clock signal (clk_out). Transistor NA1 is coupled to transistor PA2, the source voltage, to transistors NA2, and to the outgoing clock signal (clk_out). Transistor NA2 is coupled to transistor NA1, to the incoming clock signal, and to ground voltage. The default leg circuit 330 is powered ON during the operation of the controller 105.

Like with the duty cycle correction circuit 300 of FIG. 3, the duty cycle correction circuit 400 includes a first leg circuit 435. The first leg circuit 435 includes a charging circuit 436 and a discharging circuit 437. The charging circuit 436 includes transistor PB1 and a plurality of transistors 438, and the discharging circuit 437 includes transistor NB1 and a plurality of transistors 439. The transistor PB1 and the plurality of transistors 438 are P-channel MOSFETs and transistor NB1 and the plurality of transistors 439 are N-channel MOSFETs. Details about the plurality of transistors 438 and the plurality of transistors 439 are further discussed below.

The transistor PB1 is coupled to a source voltage, and to the incoming clock signal, and to the plurality of transistors 438. The plurality of transistors 438 is coupled to transistor PB1, to the zeroth bit of the inverted version of the duty cycle correction code, and to the outgoing clock signal, and to the plurality of transistors 439. The plurality of transistors 439 is coupled to the plurality of transistors 438, to the outgoing clock signal, to the zeroth bit of the duty cycle correction code, and to transistor NB2. The transistor NB2 is coupled to the plurality of transistors 439, to the incoming clock signal, and to ground voltage.

The duty cycle correction circuit 400 includes a second leg circuit 440. The second leg circuit 440 includes a charging circuit 441 and a discharging circuit 442. The charging circuit 441 includes transistor PC1 and a plurality of transistors 443, and the discharging circuit 442 includes transistor NC1 and a plurality of transistors 444. The transistor PC1 and the plurality of transistors 443 are P-channel MOSFETs and transistor NC1 and the plurality of transistors 444 are N-channel MOSFETs. Details about the plurality of transistors 443 and the plurality of transistors 444 are further discussed below.

The transistor PC1 is coupled to a source voltage, and to the incoming clock signal, and to the plurality of transistors 443. The plurality of transistors 443 is coupled to transistor PC1, to the zeroth bit of the inverted version of the duty cycle correction code, and to the outgoing clock signal, and to the plurality of transistors 444. The plurality of transistors 444 is coupled to the plurality of transistors 443, to the outgoing clock signal, to the zeroth bit of the duty cycle correction code, and to transistor NC2. The transistor NC2 is coupled to the plurality of transistors 444, to the incoming clock signal, and to ground voltage.

In some examples, the duty cycle correction circuit 400 includes a third leg circuit 445. The third leg circuit 445 includes a charging circuit 446 and a discharging circuit 447. The charging circuit 446 includes transistor PD1 and a plurality of transistors 448, and the discharging circuit 447 includes transistor ND1 and a plurality of transistors 449. The transistor PD1 and the plurality of transistors 448 are P-channel MOSFETs and transistor ND1 and the plurality of transistors 449 are N-channel MOSFETs. Details about the plurality of transistors 448 and the plurality of transistors 449 are further discussed below.

The transistor PD1 is coupled to a source voltage, and to the incoming clock signal, and to the plurality of transistors 448. The plurality of transistors 448 is coupled to transistor PD1, to the zeroth bit of the inverted version of the duty cycle correction code, and to the outgoing clock signal, and to the plurality of transistors 449. The plurality of transistors 449 is coupled to the plurality of transistors 448, to the outgoing clock signal, to the zeroth bit of the duty cycle correction code, and to transistor ND2. The transistor ND2 is coupled to the plurality of transistors 449, to the incoming clock signal, and to ground voltage.

As mentioned, transistors (also referred to as a linearizing circuit) can be used to mimic the resistors 338, 339, 343, 344, 348, and 349 of the duty cycle correction circuit 300. According to some examples, the plurality of transistors 438 mimics resistor 338, the plurality of transistors 439 mimics resistor 339, the plurality of transistors 443 mimics resistor 343, the plurality of transistors 444 mimics resistor 344, the plurality of transistors 448 mimics resistor 348, and the plurality of transistors 449 mimics resistor 349. In some examples, the plurality of transistors 438 and the plurality of transistors 439 each includes two transistors, the plurality of transistors 443 and the plurality of transistors 444 each include three transistors, and the plurality of transistors 448 and the plurality of transistors 449 each include four transistors. The plurality of transistors 438, the plurality of transistors 443, and the plurality of transistors 448 include P-channel MOSFETs, and the plurality of transistors 439, the plurality of transistors 444, and the plurality of transistors 449 include N-channel MOSFETs.

Each transistors of the pluralities of transistors 438, 439, 443, 444, 448, and 449 are connected to a bit of either the duty cycle correction code or the inverted version of the duty cycle correction code. The transistors of the plurality of transistors 438, the plurality of transistors 443, and the plurality of transistors 448 are each coupled to a bit of the inverted version of the duty cycle correction code. The transistors of the plurality of transistors 439 are coupled to the zeroth bit of the inverted version of the duty cycle correction code. The transistors of the plurality of transistors 443 are coupled to the first bit of the inverted version of the duty cycle correction code. The transistors of the plurality of transistors 449 are coupled to the second bit of the inverted version of the duty cycle correction code. Similarly, the transistors of the plurality of transistors 439, the plurality of transistors 444, and the plurality of transistors 449 are each coupled to a bit of the duty cycle correction code. The transistors of the plurality of transistors 439 are coupled to the zeroth bit of the duty cycle correction code. The transistors of the plurality of transistors 444 are coupled to the first bit of the duty cycle correction code. The transistors of the plurality of transistors 449 are coupled to the second bit of the duty cycle correction code.

As mentioned, the duty cycle correction circuit 400 can include any number of leg circuits based on the duty cycle correction code. Accordingly, any additional leg circuits includes a plurality of transistors for the charging circuit and a plurality of transistors for the discharging circuit, and the plurality of transistors for the charging circuit and the plurality of transistors for the discharging circuit for each additional leg circuit includes more transistors than the preceding leg circuit. For example, if the duty cycle correction circuit 400 includes a fourth leg circuit, the fourth leg circuit would include five transistors—one more transistor than the plurality of transistors 448 and the plurality of transistors 449 of the third leg circuit—for the plurality of transistors in the charging circuit and for the plurality of transistors in the discharging circuit. Additionally, the next bit of the duty cycle correction code (but not the most significant bit of the duty cycle correction code) is used for the pluralities of transistors for the additional leg circuits. For example, the third bit of a five-bit duty cycle correction code can be applied to the pluralities of transistors for a fourth leg circuit.

Figure 5:
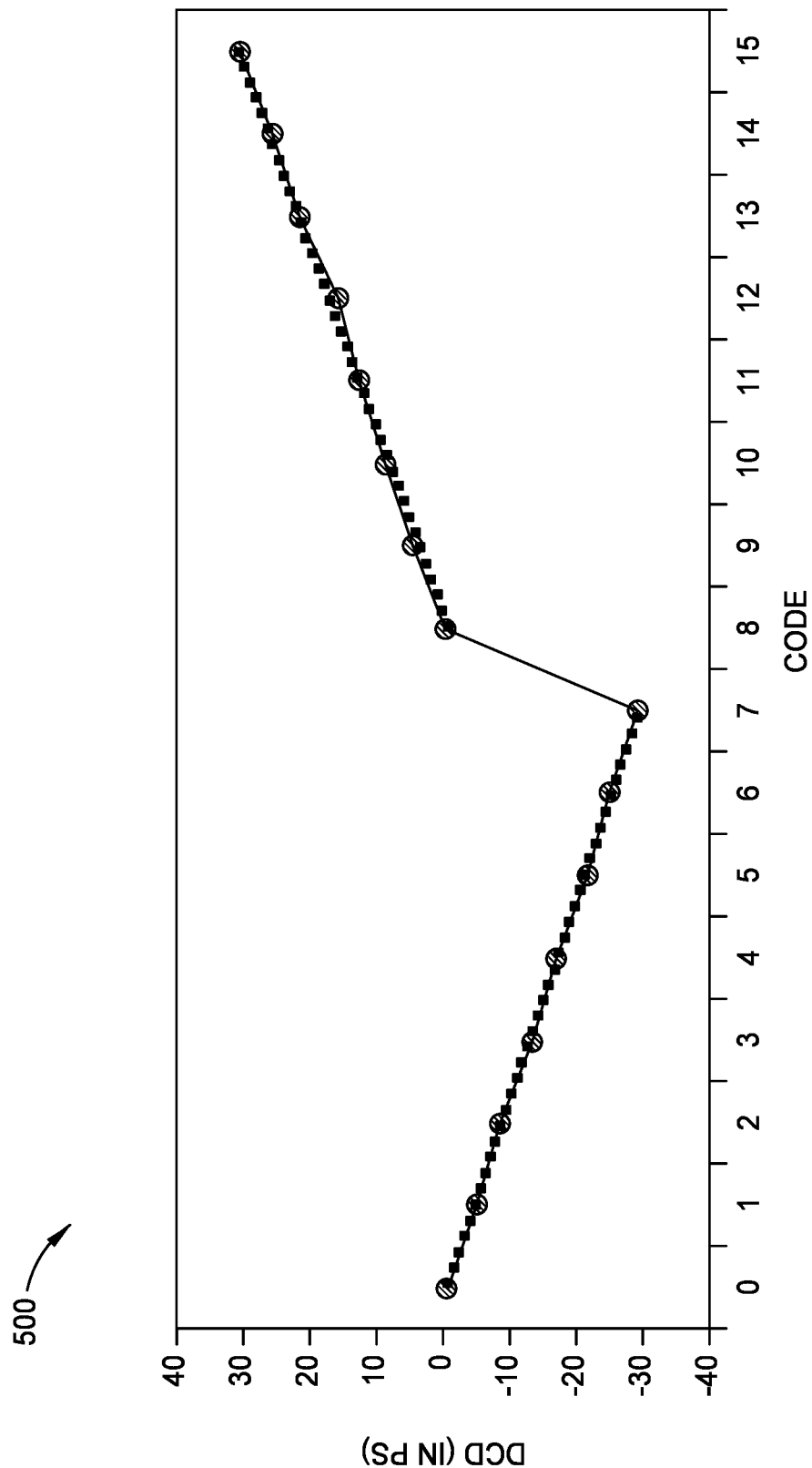
FIG. 5 illustrates a duty cycle correction graph based on duty cycle correction codes, according to some examples.

FIG. 5 illustrates a duty cycle correction graph based on duty cycle correction codes, according to some examples. As mentioned, the duty cycle correction circuit 400 increases linearity with low silicon area budget. According to some examples, duty cycle correction codes with values 1 to 7 help to correct the duty cycle distortion when the input clock signal is with more than 50% duty cycle. Similarly, duty cycle correction codes with values 9 to 15 help correct the duty cycle distortion when the input clock signal is less than 50% duty cycle. In some examples, duty cycle correction codes with values 0 and 8 can help if the duty cycle correction is not required.

| DCC code | DCD (ps) |
| --- | --- |
| 0 | −0.37 |
| 1 | −4.89 |
| 2 | −8.4 |
| 3 | −13.22 |
| 4 | −16.7 |
| 5 | −21.6 |
| 6 | −24.8 |
| 7 | −28.9 |
| 8 | −0.37 |
| 9 | 4.55 |
| 10 | 8.56 |
| 11 | 12.6 |
| 12 | 15.7 |
| 13 | 21.5 |
| 14 | 25.8 |
| 15 | 30.5 |

As illustrated in FIG. 5, for each duty cycle distortion code, the duty cycle correction circuit 400 pre-emptively corrects the clock signal for the duty cycle distortion caused by the clock network (e.g., clock network 111 of FIG. 1) of memory (e.g., memory 110 of FIG. 1). FIG. 5 illustrates the results of duty cycle correction for each duty cycle correction code, and as illustrated, the duty cycle correction of the duty cycle correction codes is substantially linear between duty cycle correction codes with values 0 through 7 and between duty cycle correction codes with values 8 through 15.

Figure 6:
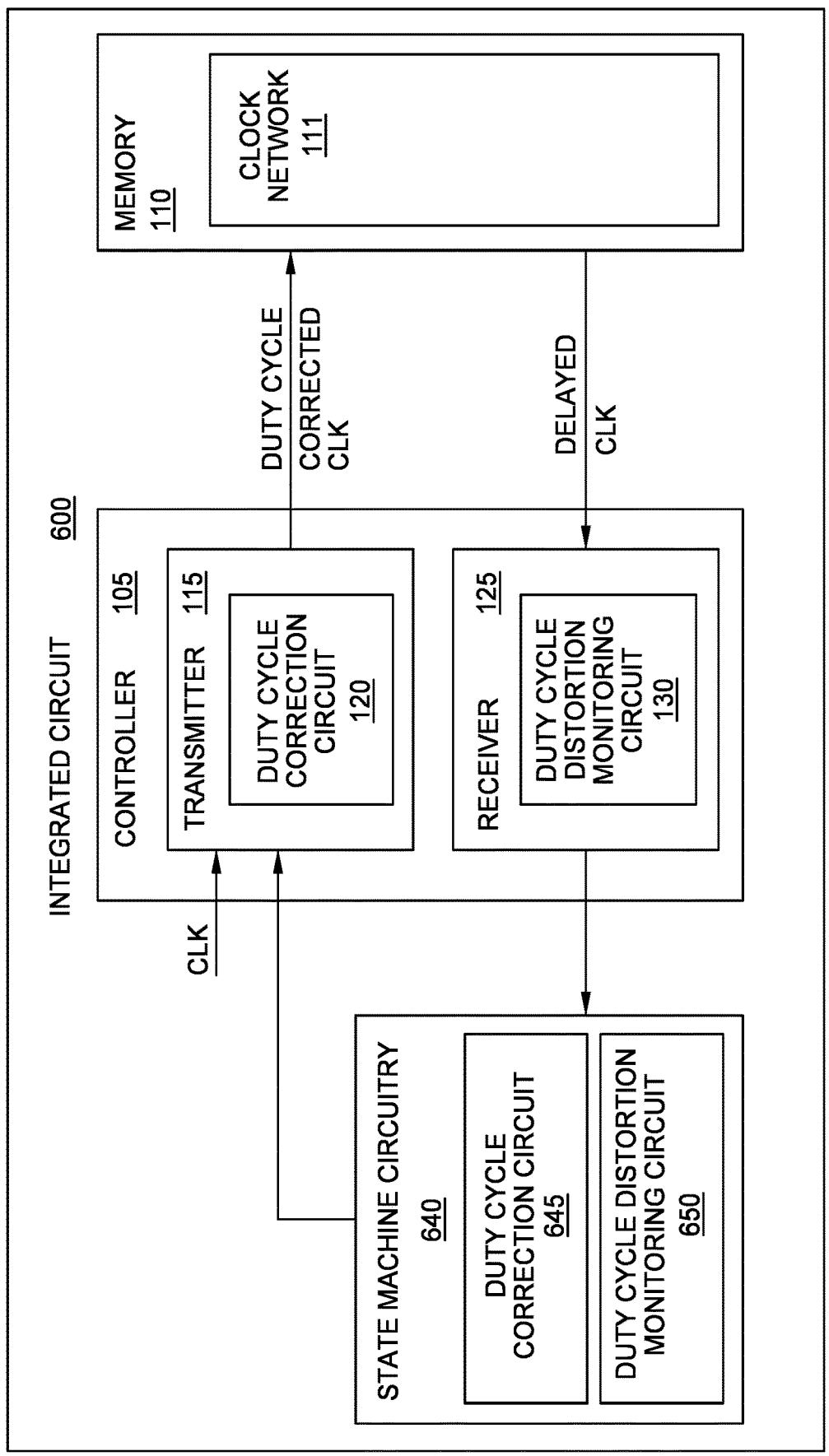
FIG. 6 is a diagram of an integrated circuit with a duty cycle corrector circuit, according to some examples.

FIG. 6 is a diagram of an integrated circuit with a duty cycle correction circuit, according to some examples. The integrated circuit 600 includes a controller 105 and memory 110. In some examples, the controller 105 with the transmitter 115, the duty cycle correction circuit 120, the receiver, and the duty cycle distortion monitoring circuit 130 can be the same controller 105 with transmitter 115, the duty cycle correction circuit 120, the receiver 125, and the duty cycle distortion monitoring circuit 130 of FIG. 1.

According to some examples, the integrated circuit 600 further includes a state machine circuit 640. The state machine circuit is coupled to the transmitter 115 and to the receiver 125. The state machine circuit 640 includes a duty cycle correction circuit 645 and the duty cycle distortion monitoring circuit 650.

The state machine circuit 640 can be used to calibrate the duty cycle correction circuit 120. For example, the clock signal after passing through the clock network 111 from the memory 110 of FIG. 1 is monitored and then compared to the clock signal that the controller receives. In some examples, the duty cycle correction circuit 645 of the state machine circuit 640 determines the duty cycle correction code for calibrating the duty cycle correction. The duty cycle correction circuit 645 of the state machine circuit 640 determines the duty cycle correction code by analyzing signals from the memory and the signals received or sent by the controller 105. The duty cycle distortion monitoring circuit 650 of the state machine circuit 640 receives signals from the receiver 125 and monitors the signals received by the receiver 125 from the memory 110.

In some examples the state machine circuit 640 keeps track of the duty cycle correction codes used in order to calibrate the duty cycle correction circuit for use with the optimal duty cycle correction code. The state machine circuit 640 can determine which duty cycle correction to use for the duty cycle correction circuit 120 so that the duty cycle correction of the signals from the memory 110 to the controller 105 is 50%.

Figure 7:
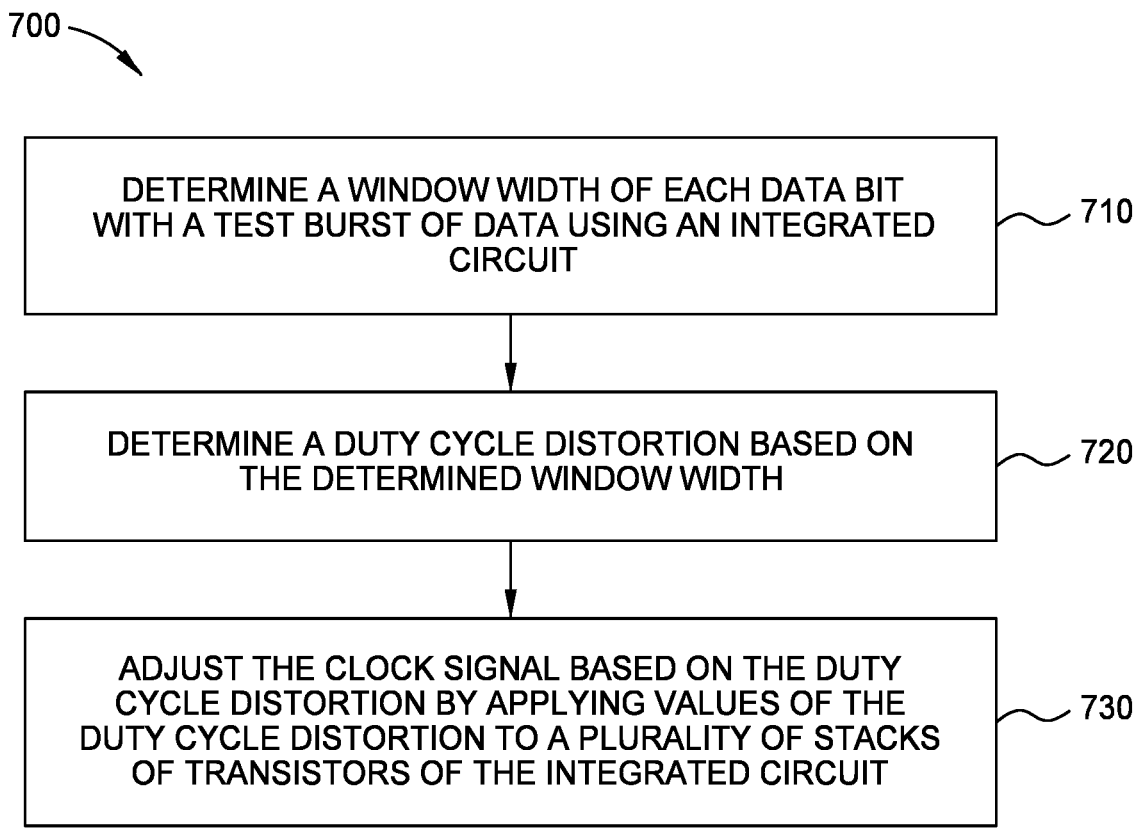
FIG. 7 is a flow diagram illustrating a method for duty cycle correction, according to some examples.

FIG. 7 is a flow diagram illustrating a method for duty cycle correction, according to some examples. The method 700 can be performed by the state machine circuit 640 of FIG. 6. The method 700 involves putting the integrated circuit (e.g., integrated circuit 100 of FIG. 1), including the controller 105 and the memory 110, in a loopback test mode. While in the loopback text mode, the controller 105 sends clock signals and data signals to the memory, and the memory 110 sends clocks signals and data signals to the controller 105. The clock signals and data signals between the controller 105 and the memory 110 can be pre-configured and known for testing purposes.

According to some examples, at block 710, the state machine circuit 640 determines a window length of each data bit with a test burst of data. The state machine circuit 640 monitors the window width of each data bit within the test data burst. In some examples, the state machine circuit 640 calculates the window width of each data bit within a data burst sent by the memory 110.

At block 720, the state machine circuit 640 determines a duty cycle distortion based on the determined window width. In some examples, upon completion of the test mode, the state machine circuit 640 determines two window sizes for each data word within a channel. The number of window sizes can depend on the number of signals sent between the controller 105 and the memory 110. The window sizes can indicate the duty cycle distortion between signals when the clock signal is relayed back to the controller 105 from the memory 110.

In some examples, the state machine circuit 640 takes the difference between each pair of window sizes within a dataword. The state machine circuit 640 averages the value across the dataword to determine the needed duty cycle correction for the channel. The state machine circuit 640 can determine the duty cycle correction code and can adjust the bit values of the duty cycle correction code such that the signals from the memory 110 to the controller 105 has a duty cycle of about 50%.

At block 730, the state machine circuit 640 adjusts the clock signal based on the duty cycle distortion by applying values of the duty cycle distortion to a plurality of plurality of transistors of the integrated circuit. For example, the state machine circuit 640 determines the duty cycle correction code, and passes the duty cycle correction code to the duty cycle correction circuit 120. The duty cycle correction circuit 120 uses the bit values of the duty cycle correction code to enable and/or disable the leg circuits of the duty cycle correction circuit 120.

In some examples, the integrated circuit 600 includes programmable configuration registers coupled to the duty cycle correction circuit 120. In such examples, the programmable configuration registers are coupled to the pluralities of transistors of the discharging circuit and of the charging circuit of each leg circuit of the duty cycle correction circuit 120. Accordingly, the duty cycle correction circuit 120 applies the duty cycle correction code as stored in the configuration registers.

Figure 8:
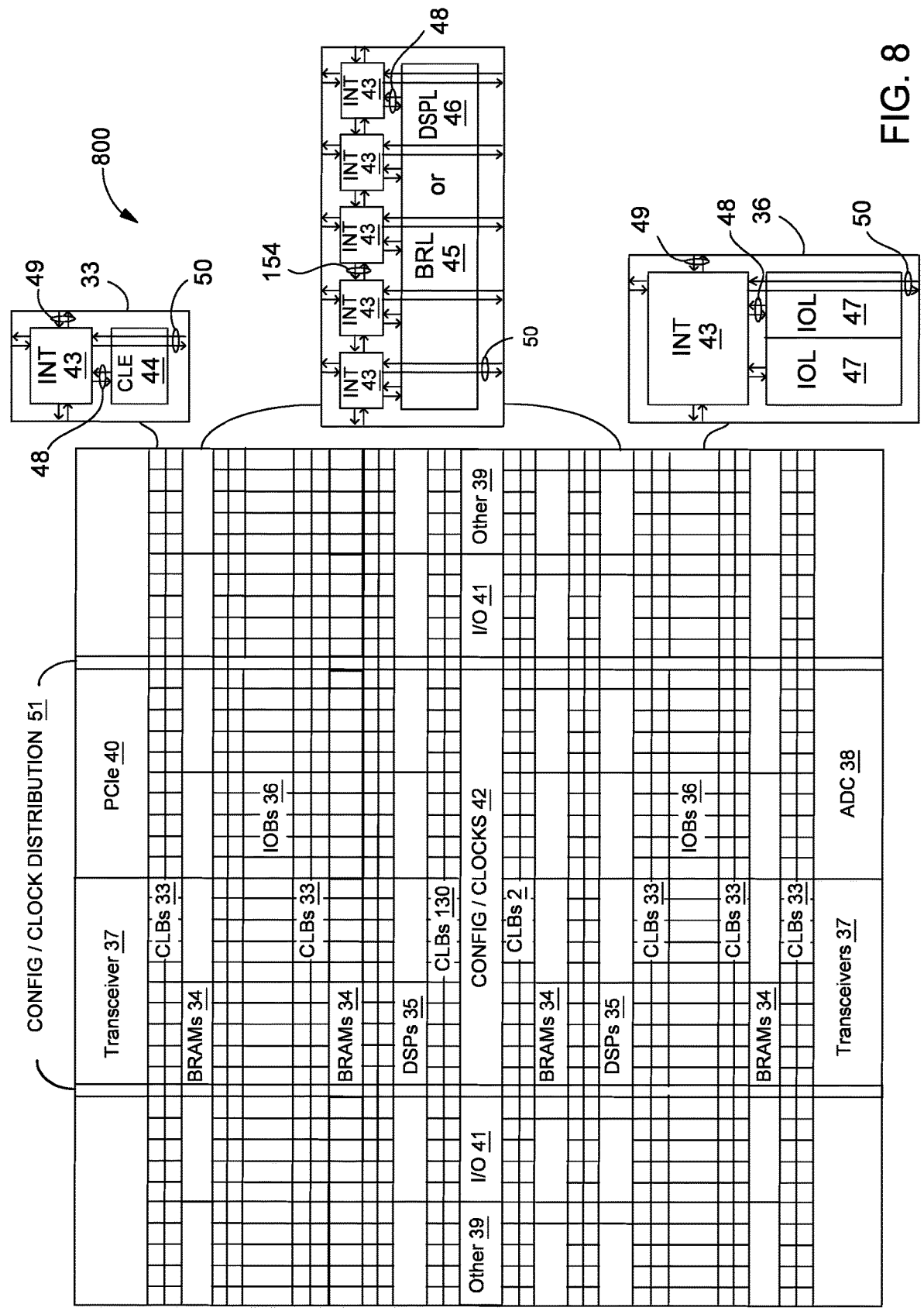
FIG. 8 illustrates a field programmable gate array (FPGA), according to some examples.

FIG. 8 illustrates an example of an FPGA 800. The FPGA 800 can be used as the IC 100. The FPGA 800 includes a programmable fabric that includes a large number of different programmable tiles including multi-gigabit transceivers ("MGTs") 37, configurable logic blocks ("CLBs") 2, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. Some FPGAs also include dedicated processor blocks ("PROC").

In some FPGAs, each programmable tile can include at least one programmable interconnect element ("INT") 43 having connections to input and output terminals 48 of a programmable logic element within the same tile. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA. Each programmable interconnect element 43 can include an interconnect circuit that can implement various types of switching among input interconnect segments and output interconnect segments, such as cross-point switching, breakpoint switching, multiplexed switching, and the like.

In an example, a CLB 2 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 166 in addition to one instance of the programmable interconnect element 43. As will be clear to those of skill in the art, the actual I/O pads connected, for example, to the I/O logic element 166 typically are not confined to the area of the input/output logic element 166.

In the pictured example, a horizontal area near the center of the die is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block spans several columns of CLBs and BRAMs. The processor block can comprise various components ranging from a single microprocessor to a complete programmable processing system of microprocessor(s), memory controllers, peripherals, and the like.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 8 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

The various examples described herein may employ various computer-implemented operations involving data stored in computer systems. For example, these operations may require physical manipulation of physical quantities usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more examples may be implemented as useful machine operations. In addition, one or more examples also relate to a device or an apparatus for performing these operations. The apparatus may be specially constructed for specific purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system. A computer readable media may be based on any existing or subsequently developed technology for embodying computer programs in a manner that enables them to be read by a computer. Examples of a computer readable medium (e.g., a non-transitory storage medium) include a hard drive, a Solid State Disk (SSD), network attached storage (NAS), read-only memory, random-access memory (e.g., a flash memory device), a CD (Compact Discs) CD-ROM, a CD-ft or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

While the foregoing is directed to specific examples, other and further examples may be devised without departing from the basic scope thereof, and the scope thereof is determined by the claims that follow.

What is claimed is:

1. An integrated circuit for correcting an input clock signal, comprising:
    a first leg circuit; and
    a second leg circuit;
    wherein the first leg circuit and the second leg circuit both comprise a charging circuit and a discharging circuit, wherein each charging circuit comprises a first plurality of transistors in series and each discharging circuit comprises a second plurality of transistors in series, wherein the charging circuit is coupled to the discharging circuit in series;
    wherein a number of transistors of the first plurality of transistors in the first leg circuit is different from a number of transistors of the first plurality of transistors in the second leg circuit.

2. The integrated circuit of claim 1, wherein the first leg circuit and the second leg circuit are each coupled to the input clock signal and are each coupled to an duty cycle corrected output clock signal; and
    wherein the first leg circuit and the second leg circuit are configured to correct a duty cycle of the input clock signal to generate the duty cycle corrected output clock signal by changing a speed of a rising edge of the input clock signal compared to a speed of a falling edge of the input clock signal.

3. The integrated circuit of claim 1, wherein the first plurality of transistors and the second plurality of transistors of each of the first leg circuit and the second leg circuit are configured to vary a time constant and edge rates of the input clock signal to generate a duty cycle corrected output clock signal.

4. The integrated circuit of claim 1, wherein, for each of the first leg circuit and the second leg circuit:
the charging circuit comprises a first transistor coupled to the input clock signal, wherein the first transistor is coupled to a source voltage and to the first plurality of transistors in series; and
the discharging circuit comprises a second transistor coupled to a ground voltage and to the second plurality of transistors in series.

5. The integrated circuit of claim 1, wherein a duty cycle corrected clock signal is coupled to the charging circuit of each of the first leg circuit and the second leg circuit and to the discharging circuit of each of the first leg circuit and the second leg circuit.

6. The integrated circuit of claim 1, wherein each of the first plurality of transistors of each of the first leg circuit and the second leg circuit is coupled to a bit signal of a duty cycle correction code and each of the second plurality of transistors is coupled to an inverted bit signal of the duty correction code.

7. The integrated circuit of claim 1, wherein the first plurality of transistors of each of the first leg circuit and the second leg circuit comprises P-channel transistors and the second plurality of transistors of each of the first leg circuit and the second leg circuit comprises N-channel transistors.

8. The integrated circuit of claim 1, further comprising a third leg circuit with a third plurality of transistors in series and a fourth plurality of transistors in series, wherein the third plurality of transistors and the fourth plurality of transistors are connected in series, wherein a duty cycle corrected output clock signal is coupled between the third plurality of transistors and the fourth plurality of transistors.

9. The integrated circuit of claim 8, wherein a number of transistors of the third plurality of transistors is equal to a number of transistors of the fourth plurality of transistors, and wherein the number of transistors of the third plurality of transistors and of the fourth plurality of transistors is different from the number of transistors of the first plurality of transistors of the first leg circuit and from the number of transistors of the first plurality of transistors of the second leg circuit.

10. The integrated circuit of claim 8, wherein:
the first plurality of transistors and the second plurality of transistors of the first leg circuit each comprise two transistors coupled together in series;
the first plurality of transistors and the second plurality of transistors of the second leg circuit each comprise three transistors coupled together in series; and
the third plurality of transistors and the fourth plurality of transistors of the third leg circuit each comprise four transistors coupled together in series.

11. An integrated circuit, comprising:
a plurality of leg circuits, wherein each leg circuit comprises:
a charging circuit, wherein the charging circuit of each leg circuit comprises a first plurality of transistors in series; and
a discharging circuit coupled in series to the charging circuit, wherein the discharging circuit of each leg circuit comprises a second plurality of transistors in series, wherein each leg circuit has a different number of transistors for the first plurality of transistors and the second plurality of transistors.

12. The integrated circuit of claim 11, wherein the first plurality of transistors and the second plurality of transistors of each of the plurality of leg circuits are configured to vary a time constant and edge rates of an input clock signal to generate a duty cycle corrected output clock signal.

13. The integrated circuit of claim 11, wherein a number of the plurality of leg circuits is one less than a number of bits of a duty cycle correction code.

14. The integrated circuit of claim 11, wherein a number of transistors of the first plurality of transistors of each leg circuit equals a number of transistors of the second plurality of transistors of each leg circuit.

15. The integrated circuit of claim 11, wherein each of the first plurality of transistors of each leg circuit is coupled to a bit signal of a duty cycle correction code and each of the second plurality of transistors is coupled to an inverted bit signal of the duty cycle correction code.

16. The integrated circuit of claim 11, wherein, for each leg circuit, a number of transistors of the first plurality of transistors is equal to a number of transistors of the second plurality of transistors.

17. The integrated circuit of claim 11, wherein the first plurality of transistors of each leg circuit comprises P-channel transistors and the second plurality of transistors of each leg circuit comprises N-channel transistors.

18. The integrated circuit of claim 11, wherein a duty cycle corrected clock signal is coupled to the charging circuit of each leg circuit and to the discharging circuit of each leg circuit.

19. An integrated circuit for correcting an input clock signal, comprising:
a default duty cycle correction leg circuit;
a first leg circuit; and
a second leg circuit;
wherein the default duty cycle correction leg circuit comprises a plurality of transistors in series, wherein the first leg circuit and the second leg circuit both comprise a charging circuit and a discharging circuit in series, wherein each charging circuit comprises a first resistor and a first plurality of transistors in series with the first resistor, and each discharging circuit comprises a second resistor and a second plurality of transistors in series with the second resistor, wherein the charging circuit is coupled in series to the discharging circuit;
wherein a value of the first resistor of the first leg circuit is different from a value of the first resistor of the second leg circuit.

20. The integrated circuit of claim 19, wherein the first resistor and the second resistor of each of the first leg circuit and the second leg circuit are configured to vary a time constant and edge rates of the input clock signal to generate a duty cycle corrected output clock signal.

* * * * *